United States Patent
Yamanaka

(10) Patent No.: US 7,065,117 B2
(45) Date of Patent: Jun. 20, 2006

(54) SEMICONDUCTOR LASER ELEMENT HAVING END-FACET PROTECTION LAYER WHICH INCLUDES UNOXIDIZED OR UNNITRIDED FIRST SUBLAYER FORMED ON END FACET AND SECOND SUBLAYER PRODUCED BY OXIDIZING OR NITRIDING THE SURFACE OF THE FIRST SUBLAYER

(75) Inventor: Fusao Yamanaka, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 179 days.

(21) Appl. No.: 10/322,599

(22) Filed: Dec. 19, 2002

(65) Prior Publication Data
US 2003/0123506 A1 Jul. 3, 2003

(30) Foreign Application Priority Data
Dec. 25, 2001 (JP) ............................. 2001/390918

(51) Int. Cl.
*H01S 3/04* (2006.01)
*H01S 5/00* (2006.01)
*H01L 21/00* (2006.01)
(52) U.S. Cl. ............................. 372/49.01; 372/43.01; 372/46.013; 438/38
(58) Field of Classification Search .................. 372/43, 372/49.01; 438/38
See application file for complete search history.

(56) References Cited

U.S. PATENT DOCUMENTS

| 4,563,368 A | * | 1/1986 | Tihanyi et al. ................. 438/38 |
| 4,656,638 A | | 4/1987 | Tihanyi et al. |
| 5,144,634 A | | 9/1992 | Gasser et al. |
| 6,323,052 B1 | | 11/2001 | Horie et al. |
| 6,529,537 B1 | | 3/2003 | Yamanaka |
| 2002/0191659 A1 | * | 12/2002 | Skogman ..................... 372/46 |

FOREIGN PATENT DOCUMENTS

CA 2018501 3/1991

* cited by examiner

*Primary Examiner*—Armando Rodriguez
(74) *Attorney, Agent, or Firm*—Sughrue Mion, PLLC

(57) ABSTRACT

A semiconductor laser element includes: a stack of layers having resonator facets; and at least one protection layer formed on at least one of the resonator facets. Each of the at least one protection layer includes at least first, second, and third sublayers. The first sublayer is formed nearest to the stack among the at least first, second, and third sublayers, and made of a material not containing oxygen (or nitrogen) as a constituent element. The second sublayer is made of an oxide (or nitride) produced by oxidizing (or nitriding) a portion of the first sublayer. The third sublayer is formed farthest from the stack among the at least first, second, and third sublayers, and made of an oxide (or nitride). The thickness d2 of the second sublayer and the total thickness d1 of the first and second sublayers satisfy a relationship, $0.1 \leq d2/d1 \leq 0.9$.

4 Claims, 7 Drawing Sheets

FIG.3A

| (1) Measuring Equipment | QUANTUM 2000, manufactured by Physical Electronics Inc. |
|---|---|
| (2) Measurement Condition | |
| Generation Condition of Excitation X-ray | Monochromatic X-ray (AlKα1:1486.6 eV) generated when an electron beam with a beam diameter of 50 μm and power of 12 W is incident on an Al target is used as Excitation X-ray. |
| Analysis Area | 50 μmφ |
| Takeoff Angle | 45 degrees |
| Pass Energy | 58.7 eV |
| Step Width | 0.125 eV |
| (3) Etching Condition | |
| Ion | $Ar^+$ |
| Acceleration Energy | 0.5 eV |
| Etching Rate | 1.4 nm/min. (in the case of $SiO_2$) |

FIG.3B

Ranges of Binding Energies of Elements

| Element | Range of Binding Energy |
|---|---|
| O1s | 526 – 537 eV |
| Ga3d | 15 – 25 eV |
| As3d | 38 – 46 eV |
| N1s | 391 – 402 eV |
| Si2p | 96 – 106 eV |
| Si-Si | peaked at 99.3 eV |
| Si-N | peaked at 101.8 eV |

SEMICONDUCTOR LASER ELEMENT HAVING END-FACET PROTECTION LAYER WHICH INCLUDES UNOXIDIZED OR UNNITRIDED FIRST SUBLAYER FORMED ON END FACET AND SECOND SUBLAYER PRODUCED BY OXIDIZING OR NITRIDING THE SURFACE OF THE FIRST SUBLAYER

BACKGROUND OF THE INVENTION

1. Field of the Invention

The present invention relates to a semiconductor laser element which has at least one protection layer on at least one end facet.

2. Description of the Related Art

One of the factors which impede increase in maximum output power of semiconductor laser elements is degradation caused by non-radiative current which is generated in vicinities of end facets of resonators when output power is high. Specifically, current which does not contribute to light emission is generated in the vicinities of the semiconductor end facets, and heat is generated at the semiconductor end facets. Therefore, facet degradation occurs due to the heat generation, and the maximum optical output power of the semiconductor laser elements is reduced. In addition, when protection layers or reflectance control layers are formed at the end facets, oxygen is captured by the semiconductor surfaces, and the characteristics of the protection layers or reflectance control layers are degraded by the oxygen. Thus, the maximum optical output power is reduced.

In order to solve the above problems, U.S. Pat. No. 4,656,638 discloses a technique in which a metal layer having a thickness of 10 nm or less is formed on a light-emission end facet so as to passivate near-edge portions of semiconductor layers, and a reflectance control layer is formed on the metal layer, where the metal layer is made of, for example, Al, Si, Ta, V, Sb, Mn, Cr, or Ti, and the reflectance control layer is made of an oxide such as $Al_2O_3$. According to the technique disclosed in U.S. Pat. No. 4,656,638, the semiconductor surface is passivated by the external diffusion of oxygen from the semiconductor layers to the metal layer. However, the metal layer is oxidized with the oxygen, and therefore the characteristics and reliability of the semiconductor laser element deteriorate. In order to solve this problem, U.S. Pat. No. 6,323,052 discloses formation of a passivated layer such as a Si layer after removal of oxide from a semiconductor surface. In addition, U.S. Pat. No. 5,144,634 corresponding to Canadian Patent Laid-open No. 2018501 discloses a technique in which a passivation layer made of Si, Ge, or Sb is formed after removal of an oxidation layer at an end facet of a resonator, and a protection layer made of $Si_3N_4$, which exhibits high thermal conductivity, is formed on the passivation layer.

Until now, many attempts have been made to form an oxidation layer after formation of a first layer which does not contain oxygen or nitrogen on an end facet of a semiconductor laser element, and many reports have been made on the constituents of the oxidation layer. However, when a reflectance control layer containing an oxide or nitride is formed on the above first layer, the reflectance control layer can be separated from the first layer by exfoliation caused by a difference in the linear expansion coefficient between the layers when heat is generated during laser oscillation. The above separation by the exfoliation becomes prominent, in particular, in a high output power operation. Therefore, sometimes the laser oscillation can suddenly stop.

It is known that the above separation by the exfoliation can be prevented by oxidizing the surface of the first layer not containing oxygen or nitrogen so as to form a thin oxide layer, and forming on the thin oxide layer a reflectance control layer made of an oxide. In addition, in the case where the reflectance control layer is made of a nitride, the above separation by the exfoliation can be prevented by nitriding the surface of the first layer so as to form a thin nitride layer. However, when the thickness of the above oxide layer or nitride layer is too great, the function of the first layer for strengthening the end facet is lost, and the characteristics of the semiconductor laser element deteriorate.

SUMMARY OF THE INVENTION

The object of the present invention is to provide a semiconductor laser element which has a protection layer on an end facet, and is highly reliable even in a high-output-power operation.

According to the first aspect of the present invention, there is provided a semiconductor laser element which includes: a stack of a plurality of layers having cleaved faces which are perpendicular to a light propagation direction and function as resonator faces; and at least one protection layer formed on at least one of the cleaved faces. Each of the at least one protection layer includes at least first, second, and third sublayers. The first sublayer is formed nearest to the stack among the at least first, second, and third sublayers, and made of a material which does not contain oxygen as a constituent element. The second sublayer is made of an oxide produced by oxidizing a portion of the first sublayer. The third sublayer is formed farthest from the stack among the at least first, second, and third sublayers, and made of an oxide. The total thickness d1 of the first and second sublayers and the thickness d2 of the second sublayer satisfy a relationship, $0.1 \leq d2/d1 \leq 0.9$.

According to the second aspect of the present invention, there is provided a semiconductor laser element which includes: a stack of a plurality of layers having cleaved faces which are perpendicular to a light propagation direction and function as resonator faces; and at least one protection layer formed on at least one of the cleaved faces. Each of the at least one protection layer includes at least first, second, and third sublayers. The first sublayer is formed nearest to the stack among the at least first, second, and third sublayers, and made of a material which does not contain nitrogen as a constituent element. The second sublayer made of an a nitride of the material. The third sublayer is formed farthest from the stack among the at least first, second, and third sublayers, and made of a nitride. The total thickness d1 of the first and second sublayers and the thickness d2 of the second sublayer satisfy a relationship, $0.1 \leq d2/d1 \leq 0.9$.

In the semiconductor laser elements according to the first and second aspects of the present invention, it is preferable that the first sublayer is made of at least one of Al, Ga, Si, Ge, Ta, and Ti.

In the semiconductor laser element according to the first aspect of the present invention, it is preferable that the third sublayer is made of an oxide of at least one of Al, Ga, Si, Ge, Ta, and Ti.

In the semiconductor laser element according to the second aspect of the present invention, it is preferable that the third sublayer is made of a nitride of at least one of Al, Ga, Si, Ge, Ta, and Ti.

The semiconductor laser element according to the first aspect of the present invention has at least three sublayers on each end facet, the first sublayer nearest to the stack is made of a material not containing oxygen as a constituent element, the second sublayer is made of an oxide produced by oxidizing a portion of the first sublayer, the third sublayer farthest from the stack is made of an oxide, and the total thickness d1 of the first and second sublayers and the thickness d2 of the second sublayer satisfy the relationship, $0.1 \leq d2/d1 \leq 0.9$. Therefore, the adhesion strength of the layers is enhanced, and thus the optical output power can be increased.

The semiconductor laser element according to the second aspect of the present invention has at least three sublayers on each end facet, the first sublayer nearest to the stack made of a material not containing nitrogen as a constituent element, the second sublayer is made of a nitride produced by nitriding a portion of the first sublayer, the third sublayer farthest from the stack is made of a nitride, and the total thickness d1 of the first and second sublayers and the thickness d2 of the second sublayer satisfy the relationship, $0.1 \leq d2/d1 \leq 0.9$. Therefore, the adhesion strength of the protection layer is enhanced, and thus the optical output power can be increased.

DESCRIPTION OF THE DRAWINGS

FIG. 3A is a diagram indicating an condition of XPS measurement.

FIG. 3B is a diagram indicating the ranges of the binding energies of related elements.

DESCRIPTION OF PREFERRED EMBODIMENTS

Embodiments of the present invention are explained in detail below with reference to drawings.

First Embodiment

Figure 1A:
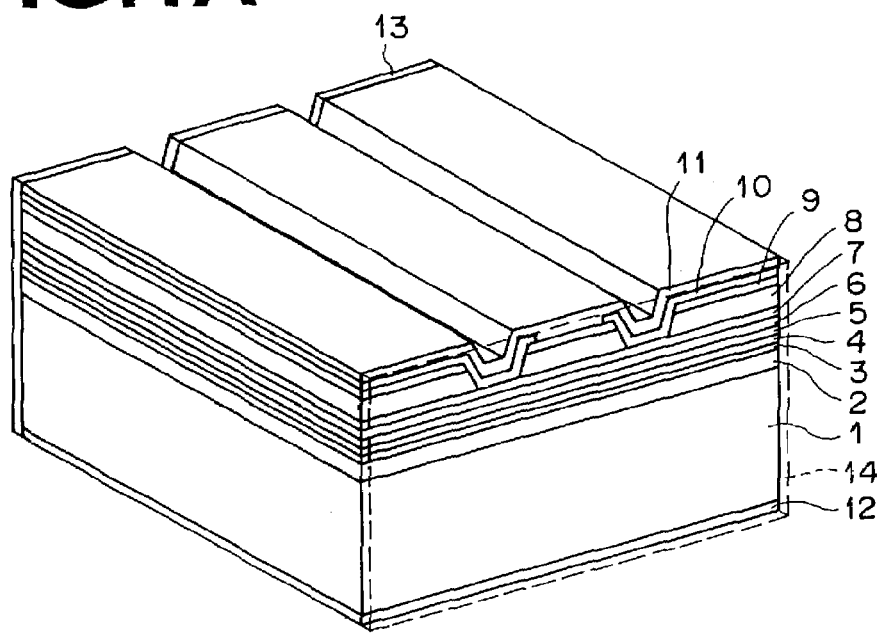
FIG. 1A is a perspective view of a semiconductor laser element as a first embodiment of the present invention.

First, a ridge-type semiconductor laser element as the first embodiment of the present invention is explained. FIG. 1A is a perspective view of the semiconductor laser element, and FIG. 1B is a local sectional view illustrating a portion of the semiconductor laser element including an end facet on which a low-reflectance film is formed.

As illustrated in FIG. 1A, the semiconductor laser element as the first embodiment comprises an n-type $Ga_{1-z1}Al_{z1}As$ lower cladding layer 2, an n-type or i-type (intrinsic) $In_{x1}Ga_{1-x1}As_{1-y1}P_{y1}$ lower optical waveguide layer 3, an i-type $In_{x2}Ga_{1-x2}As_{1-y2}P_{y2}$ lower barrier layer 4, an i-type $In_{x3}Ga_{1-x3}As_{1-y3}P_{y3}$ quantum-well active layer 5, an i-type $In_{x2}Ga_{1-x2}As_{1-y2}P_{y2}$ upper barrier layer 6, a p-type or i-type $In_{x1}Ga_{1-x1}As_{1-y1}P_{y1}$ upper optical waveguide layer 7, a p-type $Ga_{1-z1}Al_{z1}As$ upper cladding layer 8, and a p-type GaAs contact layer 9 which are formed on an n-type GaAs substrate 1 by organometallic vapor phase epitaxy. Then, an insulation film 10, a p electrode 11, and an n electrode 12 are formed on the above layers as illustrated in FIG. 1A.

Figure 1B:
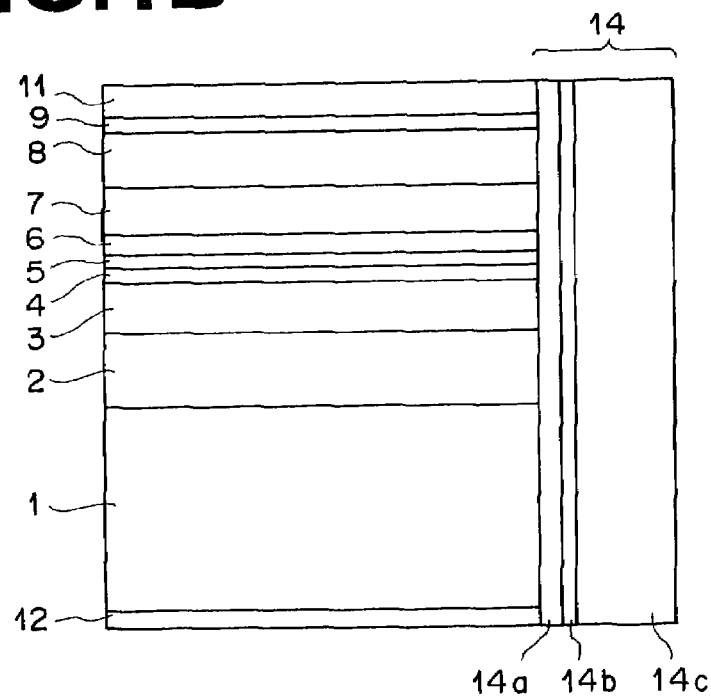
FIG. 1B is a local sectional view of the semiconductor laser element as the first embodiment.

In addition, as illustrated in FIG. 1B, a Si film 14a (as the aforementioned first sublayer), a $SiO_x$ film 14b (as the aforementioned second sublayer), and an $Al_2O_3$ film 14c (as the aforementioned third sublayer) are formed in this order on one of resonator end facets of the layered structure formed as above, where the $SiO_x$ film 14b is a thin film formed by oxidizing the surface of the Si film 14a, and the $Al_2O_3$ film 14c has a thickness corresponding to $\lambda/2$ ($\lambda=809$ nm). The Si film 14a, the $SiO_x$ film 14b, and the $Al_2O_3$ film 14c realize a low-reflectance film 14.

Further, a high-reflectance film 13 having a reflectance of 95% or greater is formed on the other resonator end facet The high-reflectance film 13 is realized by forming a Si film, a $SiO_x$ film, and a multilayer oxide structure in this order on the other resonator end facet, where the $SiO_x$ film in the high-reflectance film 13 is formed by oxidizing the surface of the Si film in the high-reflectance film 13, and the multilayer oxide structure in the high-reflectance film 13 is constituted by a plurality of oxide layers each having a thickness corresponding to $\lambda/4$.

Furthermore, the n-type $Ga_{1-z1}Al_{z1}As$ lower cladding layer 2, the n-type or i-type $In_{x1}Ga_{1-x1}As_{1-y1}P_{y1}$ lower optical waveguide layer 3, the p-type or i-type $In_{x1}Ga_{1-x1}As_{1-y1}P_{y1}$ lower optical waveguide layer 7, and the p-type $Ga_{1-z1}Al_{z1}As$ upper cladding layer 8 have such compositions as to lattice-match with the GaAs substrate 1.

In the above construction, the total thickness d1 of the Si film 14a and the $SiO_x$ film 14b and the thickness d2 of the $SiO_x$ film 14b satisfy the relationship, $0.1 \leq d2/d1 \leq 0.9$. Thus, it is possible to prevent film separation by exfoliation, and increase the maximum optical output power.

Second Embodiment

Figure 2:
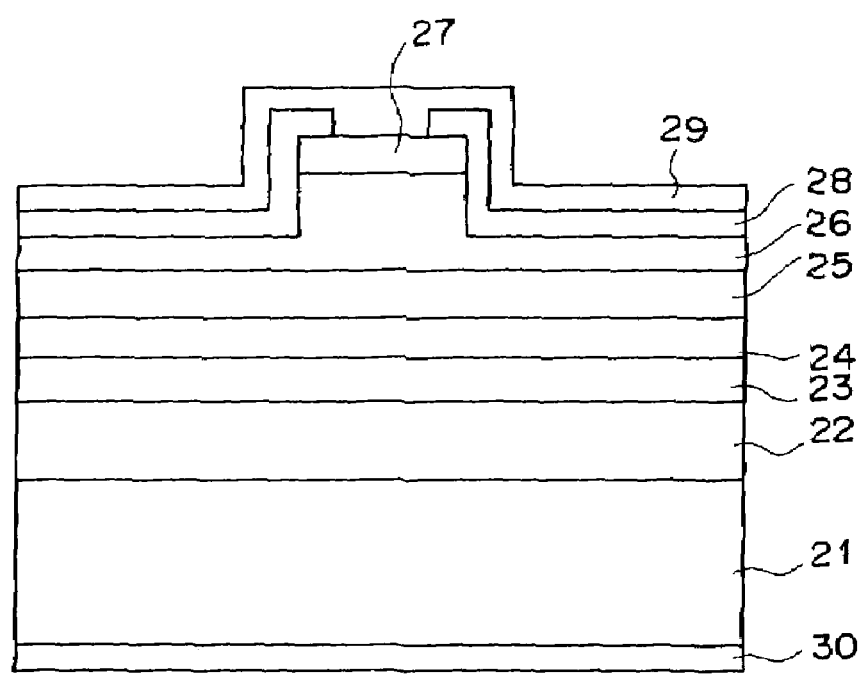
FIG. 2 is a cross-sectional view of a semiconductor laser element as a second embodiment of the present invention.

Next, a ridge-type semiconductor laser element as the second embodiment of the present invention is explained. FIG. 2 is a cross-sectional view of the semiconductor laser element as the second embodiment.

As illustrated in FIG. 2, the semiconductor laser element as the second embodiment comprises an n-type $In_{0.49}(Ga_{1-z1}Al_{z1})_{0.51}P$ lower cladding layer 22 ($0 \leq z1 \leq 0.5$), an i-type $In_{x2}Ga_{1-x2}As_{1-y2}P_{y2}$ lower optical waveguide layer 23 ($x2=0.49y2\pm0.01$, $0.1 \leq y2 \leq 0.9$), an i-type $In_{x3}Ga_{1-x3}As_{1-y3}P_{y3}$ quantum-well active layer 24 ($0 \leq x3 < 0.5$, $0 \leq y3 \leq 0.6$), an i-type $In_{x2}Ga_{1-x2}As_{1-y2}P_{y2}$ upper optical waveguide layer 25 ($x2=0.49y2\pm0.01$, $0.1 \leq y2 \leq 0.9$), a p-type $In_{0.49}(Ga_{1-z1}Al_{z1})_{0.51}P$ upper cladding layer 26, and a p-type GaAs contact layer 27 which are formed on an n-type GaAs substrate 21 by organometallic vapor phase epitaxy. Then, an insulation film 28, a p electrode 29, and an n electrode 30 are formed on the above layers as illustrated in FIG. 2.

In addition, as illustrated in FIG. 2, a ridge stripe structure having a width of 5 micrometers or smaller is formed by etching both sides of the ridge stripe to a mid-thickness of the p-type $In_{0.49}(Ga_{1-z1}Al_{z1})_{0.51}P$ upper cladding layer 26. This semiconductor laser element oscillates in a single transverse mode.

Further, a Si film (as the aforementioned first sublayer), a $SiO_x$ film (as the aforementioned second sublayer), and an $Al_2O_3$ film (as the aforementioned third sublayer) are formed in this order on one of resonator end facets of the layered structure formed as above, where the $SiO_x$ film is formed by oxidizing the surface of the Si film. The Si film, the $SiO_x$ film, and the $Al_2O_3$ film realize a low-reflectance coating. In addition, a high-reflectance film having a reflectance of 95% or greater is formed on the other resonator end facet in a similar manner to the first embodiment.

In the above low-reflectance coating, the total thickness d1 of the Si film and the $SiO_x$ film and the thickness d2 of the $SiO_x$ film satisfy the relationship, $0.1 \leq d2/d1 \leq 0.9$. Thus, it is possible to achieve high maximum optical output power without separation of the protection film by exfoliation.

Alternatively, the lower cladding layer 22 and the upper cladding layer 26 may be made of $Ga_{1-z1}Al_{z1}As$ ($0.55 \leq z1 \leq 1.0$).

Variations of First and Second Embodiments (i) Since the quantum-well active layers in the first and second embodiments are made of $In_{x3}Ga_{1-x3}As_{1-y3}P_{y3}$ ($0 \leq x3 \leq 0.5$, $0 \leq y3 \leq 0.6$), the oscillation wavelengths of the semiconductor laser devices as the first and second embodiments can be controlled in the range of 750 to 1,200 nm.

(ii) In the semiconductor laser elements as the first and second embodiments, the Si films as the first sublayer may be made of at least one of Al, Ga, Ge, Ta, and Ti, instead of Si.

(iii) In the semiconductor laser elements as the first and second embodiments, the oxide films as the third sublayer may be made of an oxide of at least one of Al, Ga, Ge, Ta, and Ti. Alternatively, the oxide films as the third sublayer may be a multilayer in which a plurality of layers each made of an oxide of at least one of Si, Al, Ga, Ge, Ta, and Ti are stacked.

(iv) Each layer in the constructions of the first and second embodiments may be formed by molecular beam epitaxy using solid or gas raw material.

(v) Although the n-type GaAs substrates are used in the constructions of the first and second embodiments, instead, p-type GaAs substrates may be used. When the GaAs substrate in the construction of each embodiment is a p-type, the conductivity types of all of the other layers in the construction should be inverted.

(vi) In each of the first and second embodiments, the first sublayer constituting the protection layer is made of a material not containing oxygen as a constituent element, the second sublayer is made of an oxide produced by oxidizing a portion of the first sublayer, and the third sublayer is made of an oxide. Alternatively, the protection layer may be constituted by a first sublayer made of Si, a second sublayer made of a $SiN_x$ film produced by nitriding a portion of the first sublayer, and a third sublayer made of $Si_3N_4$ or AlN, where the total thickness d1 of the Si film and the $SiN_x$ film and the thickness d2 of the $SiN_x$ film satisfy the relationship, $0.1 \leq d2/d1 \leq 0.9$. In this case, it is also possible to achieve high maximum optical output power without separation of the protection film by exfoliation.

The above $SiN_x$ film as the second sublayer can be produced by introducing nitrogen into a vacuum device so as to maintain a $N_2/Ar$ flow ratio of 25% after the Si film as the first sublayer is formed in the vacuum device, and bombarding the Si film with nitrogen ion plasma which is generated by an ion source. It is possible to control the thickness of the $SiN_x$ film by appropriately adjusting the acceleration voltage in the ion bombardment within the range of 10 to 50 eV.

In the above case, the Si films as the first sublayer may be made of at least one of Al, Ga, Ge, Ta, and Ti, instead of Si. In addition, the nitride film as the third sublayer may be a nitride of at least one of Al, Ga, Ge, Ta, and Ti. Alternatively, the nitride film as the third sublayer may be a multilayer in which a plurality of layers each made of a nitride of at least one of Al, Ga, Ge, Ta, and Ti (i.e., at least one of AlN, GaN, $Ge_3N_4$, TaN, and TiN) are stacked.

Next, the semiconductor laser elements according to the present invention are explained in more detail by concrete examples.

CONCRETE EXAMPLE I

In the concrete example I, the semiconductor laser element as the first embodiment is produced as explained below. As illustrated in FIG. 1A, an n-type $Ga_{0.39}Al_{0.61}As$ lower cladding layer 2, an n-type or i-type $In_{0.49}Ga_{0.51}P$ lower optical waveguide layer 3, an i-type $In_{0.4}Ga_{0.6}P$ lower tensile-strain barrier layer 4, an i-type $In_{0.13}Ga_{0.87}As_{0.75}P_{0.25}$ quantum-well active layer 5, an i-type $In_{0.4}Ga_{0.6}P$ upper tensile-strain barrier layer 6, a p-type or i-type $In_{0.49}Ga_{0.51}P$ upper optical waveguide layer 7, a p-type $Ga_{0.39}Al_{0.61}As$ upper cladding layer 8, and a p-type GaAs contact layer 9 are formed on an n-type GaAs substrate 1 by organometallic vapor phase epitaxy. Although not shown, at this time, a p-type InGaP etching stop layer having a thickness of about 10 nm is formed at a mid-thickness of the p-type $Ga_{0.39}Al_{0.61}As$ upper cladding layer 8.

Next, a first insulation film is formed on the p-type GaAs contact layer 9, first stripe areas of the first insulation film located on both sides of a second stripe area are removed by conventional lithography, where the first stripe areas each has a width of about 10 micrometers, and the second stripe area has a width of about 50 micrometers. Then, stripe portions of the semiconductor layers under the removed first stripe areas are removed down to the upper surface of the p-type InGaP etching stop layer by wet etching. Thus, it is possible to accurately form a ridge stripe structure having a desired stripe width. When a solution of sulfuric acid and hydrogen peroxide is used as an etchant, the etching automatically stops at the upper surface of the p-type InGaP etching stop layer.

After the remaining area of the first insulation film is removed, a second insulation film 10 is formed over the above layered structure, and a stripe area of the second insulation film 10 being located on the top of the ridge stripe and having a width of 50 micrometers is removed, and a p electrode 11 is formed on the upper side of the ridge stripe structure. In addition, a Au plating film having a thickness of 5 micrometers or greater is formed over the p electrode 11.

Finally, the bottom surface of the n-type GaAs substrate 1 is polished so as to reduce the thickness of the semiconductor laser element to 100 to 150 micrometers, and an n electrode 12 is formed on the polished surface.

In this example, the thickness of each of the n-type or i-type $In_{0.49}Ga_{0.51}P$ lower optical waveguide layer 3 and the p-type or i-type $In_{0.49}Ga_{0.51}P$ upper optical waveguide layer 7 is 0.4 micrometers, and the oscillation wavelength in this example is 810 nm.

In practice, a plurality of layered structures each corresponding to a semiconductor laser element are concurrently formed on a substrate having a form of a wafer. After the above semiconductor layers and electrodes are formed on the wafer, the wafer is cleaved in air into a plurality of bars each having a length of 10 to 20 mm and a width corresponding to a resonator length of 0.9 mm, where the wafer is cleaved in such a direction that (100) faces are exposed as light-emission end facets.

Then, each bar is fixed to a jig designed for coating the light-emission end facets, and set in a sputtering system, and the system is evacuated to vacuum. When the total pressure falls below $1\times10^{-4}$ Pa, Ar is introduced into the sputtering system, and the Ar gas pressure is set within the range from $0.3\times10^{-1}$ to $1.1\times10^{-1}$ Pa. Thereafter, as illustrated in FIG. 1B, a Si film 14a having a thickness of about 1 nm is formed by using a Si target having a purity of 99.999% or higher.

Next, a thin $SiO_x$ film 14b as the second sublayer can be produced by introducing oxygen into the same vacuum system so as to maintain an $O_2$/Ar flow ratio of 25%, and bombarding the Si film 14a with oxygen ion plasma which is generated by an ion source. Thereafter, an $Al_2O_3$ film 14c having a thickness corresponding to $\lambda/2$ ($\lambda=810$ nm) is formed by using a sputtering source in which an Al target is mounted. During the formation of the $Al_2O_3$ film 14c, the above $O_2$/Ar flow ratio is maintained. Thus, a low-reflectance film 14 is formed on the light-emission end facets.

On the opposite end facets, a Si film having a thickness of 1 nm is formed in a similar manner, and a $SiO_x$ film is formed by oxidizing the surface of the Si film. Thereafter, a multilayer structure constituted by oxide layers each having a thickness corresponding to $\lambda/4$ is formed so that a high-reflectance film 13 having a reflectance of 95% or greater is realized. For example, the multilayer structure is made of $Al_2O_3/TiO_2/SiO_2/TiO_2/SiO_2/TiO_2/SiO_2/TiO_2/SiO_2/TiO_2$.

After the protection films are formed as above on the forward and backward end facets of the bar corresponding to a plurality of semiconductor laser elements, the bar is cleaved into the separate semiconductor laser elements each having a width of 500 to 600 micrometers.

A semiconductor laser element produced as above is mounted on a heatsink, which is produced by forming a Ni plating film having a thickness of 5 micrometers on copper, and a Ni film having a thickness of 50 to 150 nm, a Pt film having a thickness of 50 to 200 nm, and an In film having a thickness of 3.5 to 5.5 micrometers are deposited in this order by evaporation. Thereafter, the p side of the semiconductor laser element is bonded to the above heatsink by heating the heatsink in the temperature range of 180 to 220° C. so as to melt the In film.

Evaluation of Protection Film

Hereinbelow, a relationship between the thickness of the end facet protection film of the semiconductor laser element as the concrete example I and its optical output power is explained.

Figure 4:
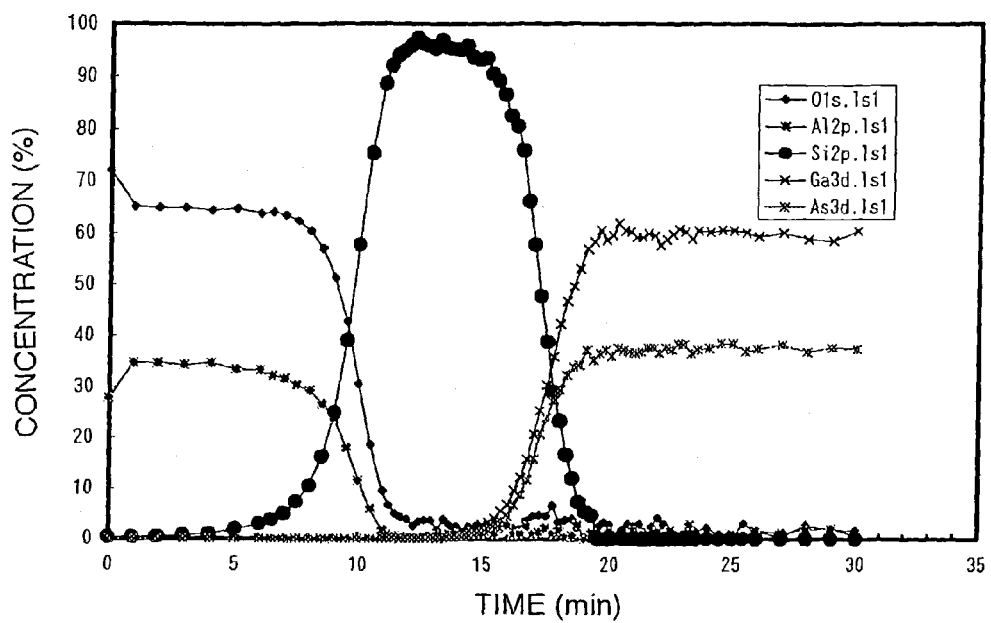
FIG. 4 is a graph indicating results of XPS measurement of a semiconductor laser element used as a sample for explaining the analysis method.

First, a method used for evaluating the protection film is explained. The peaks of Al2p, Si2p, and O1s are measured along the depth direction of the protection film on the end facet by using XPS (X-ray photoelectron spectrometry) under the measurement condition indicated in FIG. 3A. FIG. 4 is a graph indicating results of the XPS measurement of a semiconductor laser element used as a sample for explaining the analysis method. In this sample, a Si film having a thickness of 20 nm is formed on a resonator end facet as the first sublayer, a $SiO_x$ film is produced as the second sublayer by oxidizing the surface of the first sublayer, and an $Al_2O_3$ film having a thickness of 20 nm is formed as the third sublayer on the second sublayer.

Figure 5:
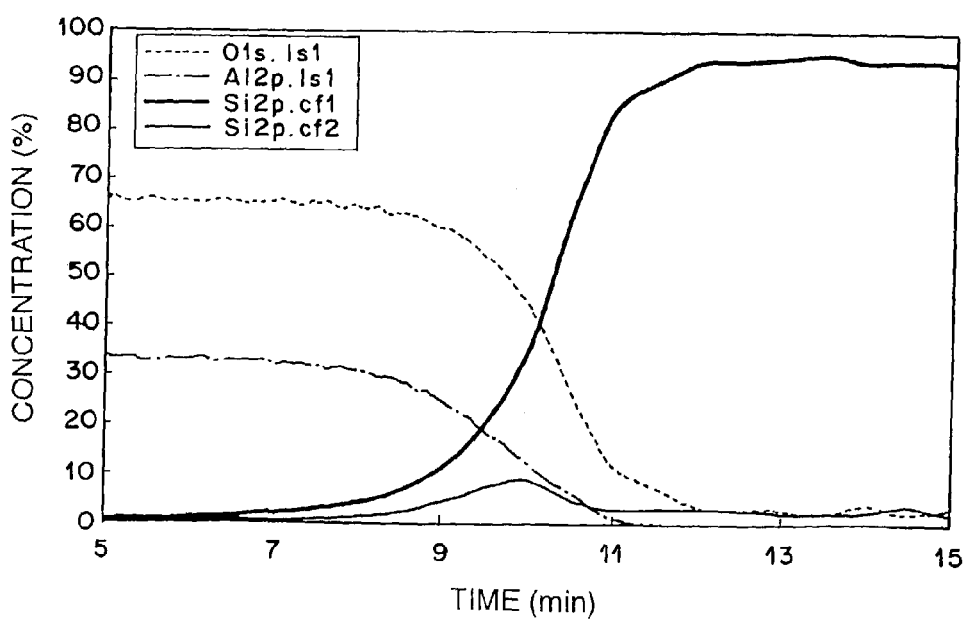
FIG. 5 is a graph indicating depth profiles obtained from the results the XPS measurement.

The Si2p spectrum indicated in FIG. 4 is separated into portions respectively attributed to Si—Si bonds and Si—O bonds. In FIG. 5, the spectrum corresponding to the Si—Si bonds is labeled with Si2p.cf1, and the spectrum corresponding to the Si—O bonds is labeled with Si2p.cf2. FIG. 5 is a graph indicating depth profiles obtained from the results of the XPS measurement. In the depth profiles indicated in FIG. 5, the concentrations of the elements are respectively obtained by calculating areas in the binding energy ranges corresponding to the Al1s, Si2p, and O1s peaks in spectra based on the Shirley-type background subtraction method. FIG. 3B shows the ranges of the binding energies of O1s, Ga3d, As3d, N1s, and Si2p and the peak values of the binding energies of the Si—Si bonds and the Si—N bonds. FIG. 5 shows that a $SiO_x$ layer exists between a Si layer and an $Al_2O_3$ layer, and the depth profile corresponding to the $SiO_x$ layer is nearly a Gauss distribution along the depth direction.

Figure 6:
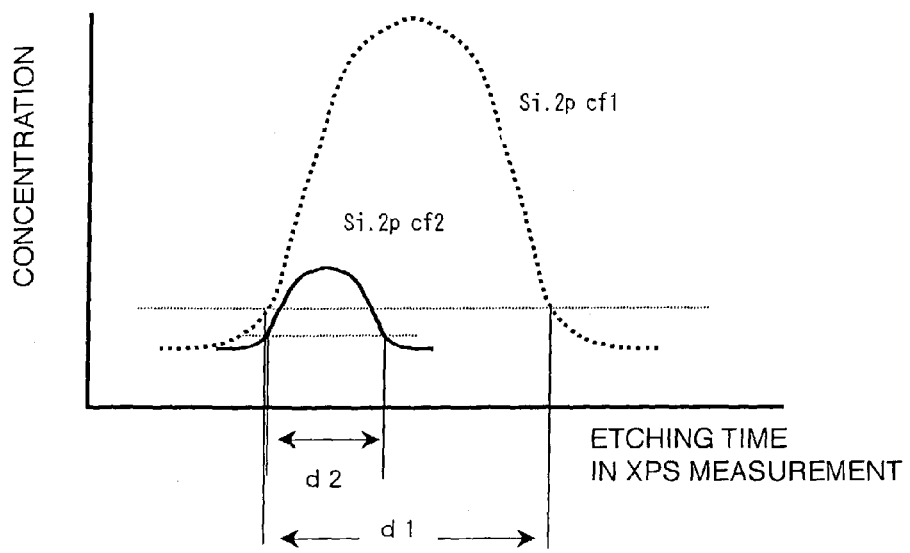
FIG. 6 is a graph indicating definitions of the total thickness of first and second sublayers and the thickness of the second sublayer.

As indicated in FIG. 6, the total thickness d1 of the first and second sublayers is defined by the range in which the intensity of the depth profile of Si2p.cf1 is equal to or greater than one-tenth of the maximum intensity of the depth profile of Si2p.cf1, and the thickness d2 of the second sublayer is defined by the range in which the intensity of the depth profile of Si2p.cf2 is equal to or greater than one-tenth of the maximum intensity of the depth profile of Si2p.cf2.

The present inventor has investigated a relationship between the thickness of the $SiO_x$ film as the second sublayer and the maximum optical output power by using the above evaluation method. In the investigation, a plurality of samples of the semiconductor laser element as the concrete example I are produced by changing the acceleration voltage in the oxygen ion plasma bombardment within the range of 10 to 50 eV so that the thicknesses of both resonator end facets in the samples are varied in similar manners. Then, the total thickness d1 of the Si film and the $SiO_x$ film and the thickness d2 of the $SiO_x$ film in each sample are obtained based on the definitions indicated in FIG. 6.

Figure 7:
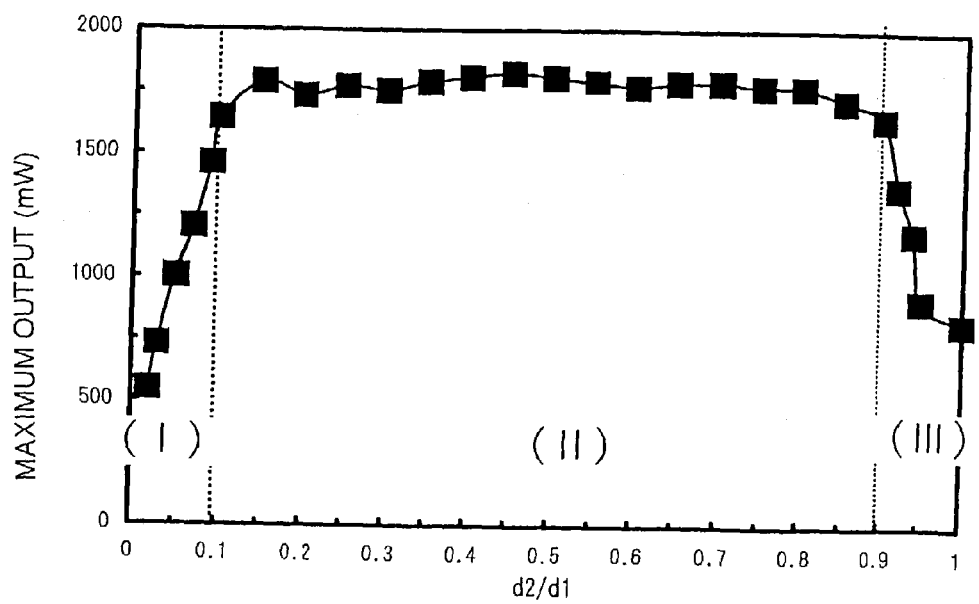
FIG. 7 is a graph indicating a relationship between the value of d2/d1 and maximum optical output power.
Figure 8:
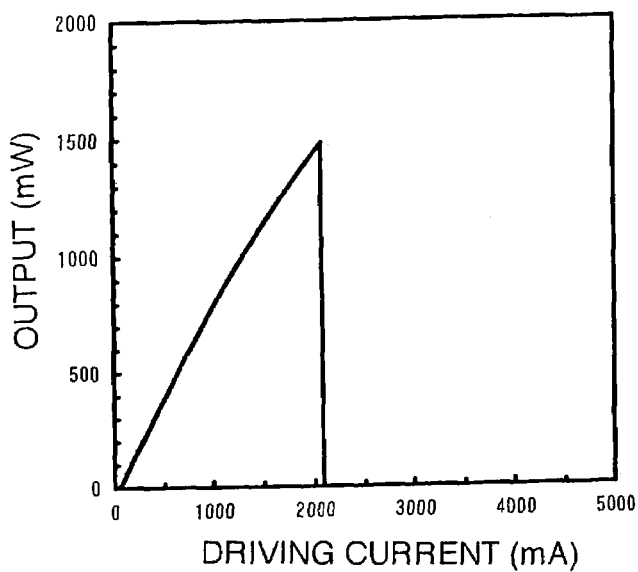
FIG. 8 is a graph indicating a driving current-output characteristic in the ranges (I) and (III) in FIG. 7.

FIG. 7 is a graph indicating a relationship between the value of d2/d1 and the maximum optical output power. As indicated in FIG. 7, in the range (I) in which d2/d1<0.1, the maximum optical output power is low. As indicated in FIG. 8, the present inventor has confirmed that oscillation in the semiconductor laser elements in the range (I) suddenly stops when the current increases to a certain value. In addition, the present inventor has observed the protection films in the end facets of the semiconductor laser elements in the range (I) by a microscope after the test in which the current is increased to the certain value is performed, and found that the protection film is separated by exfoliation in every sample in the range (I). Further, the present inventor has obtained similar results in the samples in the range (III) in which d2/d1>0.9.

Figure 9:
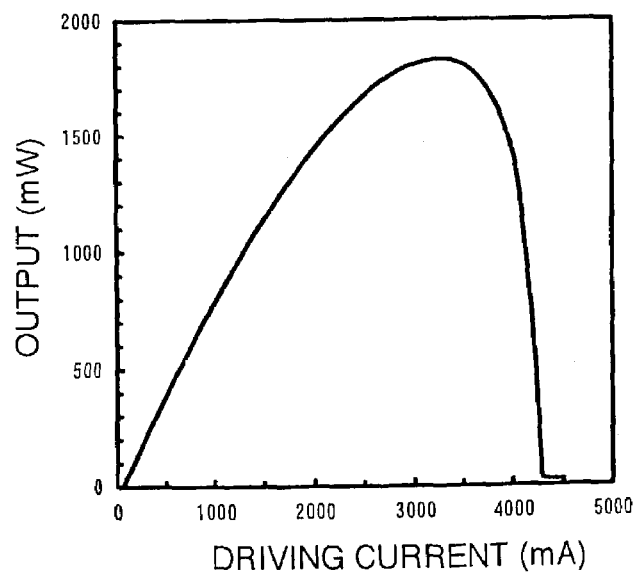
FIG. 9 is a graph indicating a driving current-output characteristic in the range (II) in FIG. 7.

On the other hand, as indicated in FIG. 7, in the range (II) in which $0.1 \leq d2/d1 \leq 0.9$, the maximum optical output power is high. As indicated in FIG. 9, the output power of the samples in the range (II) becomes saturated due to decrease in emission efficiency which is caused by temperature rise of the entire element during high current operations. However, the present inventor has confirmed that no separation occurs in the protection films of the samples in the range (II).

In the semiconductor laser elements according to the present invention, the oxide film as the second sublayer in the end-facet protection film is formed by oxidizing the surface of the first sublayer. Therefore, the end-facet protection film formed according to the present invention has very high adhesion strength, compared with the case where $SiO_x$ is deposited over a Si film. Thus, it is possible to prevent film separation by exfoliation, and increase the maximum optical output power.

CONCRETE EXAMPLE II

In the semiconductor laser element as the concrete example II, the upper and lower cladding layers are made of $In_{0.49}Ga_{0.51}P$, the upper and lower optical waveguide layers are made of $In_{0.2}Ga_{0.8}As_{0.6}P_{0.4}$, the upper and lower barrier layers are made of $GaAs_{0.8}P_{0.2}$, the quantum-well active layer is made of $In_{0.3}Ga_{0.7}As$, and the oscillation wavelength is 1,060 nm. In addition, oxide-based, end-facet protection films are formed on resonator end facets in similar manner to the concrete example I. In the semiconductor laser element as the concrete example II, it is also possible to prevent film separation by exfoliation, and obtain high maximum optical output power.

As explained above, in the semiconductor laser elements according to the present invention, it is possible to realize an end-facet protection film in which exfoliation does not occur even in a high output power operation. Therefore, the reliability in the high output power operation can be increased.

Additional Matters (i) The present invention is not limited to the above embodiments, and can also be applied to other semiconductor laser devices which have semiconductor laser structures using the following materials:
  (a) InGaN-based materials realizing oscillation wavelengths of 360 to 500 nm;
  (b) ZnSSe-based materials realizing oscillation wavelengths of 410 to 540 nm;
  (c) InGaAlP-based materials realizing oscillation wavelengths of 600 to 730 nm;
  (d) AlGaAs-based materials realizing oscillation wavelengths of 750 to 870 nm;
  (e) InGaAsP-based materials realizing oscillation wavelengths of 700 to 1,200 nm and 1,300 to 1,900 nm;
  (f) InGaAs-based materials realizing oscillation wavelengths of 950 to 1,200 nm and 1,300 to 1,900 nm; and
  (g) InGaSb-based materials realizing oscillation wavelengths of 1.8 to 3.0 micrometers.

(ii) The present invention can also be applied to semiconductor-insulator interfaces in gates of electronic devices made of InGaAs-based materials. Such electronic devices include the MISFET (metal-insulator-semiconductor field effect transistor) and the HBT (heterojunction bipolar transistor).

What is claimed is:

1. A semiconductor laser element comprising:
   a stack of a plurality of layers having cleaved faces which are perpendicular to a light propagation direction and function as resonator faces; and
   at least one protection layer formed on at least one of said cleaved faces;
   wherein each of said at least one protection layer includes at least first, second, and third sublayers,
   said first sublayer is formed nearest to said stack among said at least first, second, and third sublayers, and made of a material which does not contain oxygen as a constituent element,
   said second sublayer which is made of a material comprising an oxide produced by oxidizing a portion of said first sublayer, and has a thickness d2,
   said third sublayer is formed farthest from said stack among said at least first, second, and third sublayers, and made of a material comprising an oxide,
   said first and second sublayers have a total thickness d1, and
   said total thickness d1 and said thickness d2 of said second sublayer satisfy a relationship, $0.1 \leq d2/d1 \leq 0.9$.

2. A semiconductor laser element according to claim 1, wherein said first sublayer is made of at least one of Al, Ga, Si, Ge, Ta, and Ti.

3. A semiconductor laser element according to claim 1, wherein said third sublayer is made of a material comprising an oxide of at least one of Al, Ga, Si, Ge, Ta, and Ti, and the material of which said third sublayer is made is different from the material of which said second sublayer is made.

4. A semiconductor laser element according to claim 2, wherein said third sublayer is made of a material comprising an oxide of at least one of Al, Ga, Si, Ge, Ta, and Ti, and the material of which said third sublayer is made is different from the material of which said first sublayer is made.

* * * * *